United States Patent [19]

Mazumder et al.

[11] Patent Number: 4,626,709
[45] Date of Patent: Dec. 2, 1986

[54] DYNAMIC PUSH-PULL FOR ECL

[75] Inventors: Nikhil C. Mazumder, San Jose; Frederick N. Lancia, II, Sunnyvale, both of Calif.

[73] Assignee: Advanced Micro Devices, Inc., Sunnyvale, Calif.

[21] Appl. No.: 656,101

[22] Filed: Sep. 28, 1984

[51] Int. Cl.$^4$ ................ H03K 19/013; H03K 19/086
[52] U.S. Cl. ................................ 307/455; 307/443; 307/446; 307/246; 307/270
[58] Field of Search .......... 307/200 A, 443, 454–455, 307/242, 246, 263, 270, 446

[56] References Cited

U.S. PATENT DOCUMENTS

| | | | |
|---|---|---|---|
| 4,276,485 | 6/1981 | Rydval | 307/455 X |
| 4,387,197 | 5/1983 | Kiyozuka | 307/443 X |
| 4,490,630 | 12/1984 | Freeman | 307/455 |
| 4,539,493 | 9/1985 | Varadarajan | 307/455 |

*Primary Examiner*—Stanley D. Miller
*Assistant Examiner*—D. R. Hudspeth
*Attorney, Agent, or Firm*—Patrick T. King; Davis Chin; J. Vincent Tortolano

[57] ABSTRACT

An improved ECL gate having faster output transition times without requiring additional current is provided. Two switching transistors have their emitter terminals connected to a first current source. A reference switching transistor has its base connected to a reference voltage and an input switching transistor has its base connected to an input terminal. An emitter follower transistor is coupled to each switching transistor. A second current source is connected to each of the emitter follower transistors by coupling circuitry which shunts current from one emitter follower to the other thereby increasing the transition speed of the outputs. In the preferred embodiment, the emitters of the current source transistors for the two outputs are coupled through a common resistance to ground. The collector of the inverting emitter-coupled transistor is coupled via a capacitor to the base of the current source transistor for the non-inverting output. The collector of the non-inverting emitter-coupled transistor is coupled via a second capacitor to the base of the current source transistor for the inverting output. The base of each such current source transistor is coupled to a current source voltage via a resistance or a diode. The capacitance coupling essentially causes only one of such current source transistors to be turned on at any one time during switching. This forces all the current through one or the other of the current source transistors, thus allowing the output which requires such current to change states faster.

6 Claims, 4 Drawing Figures

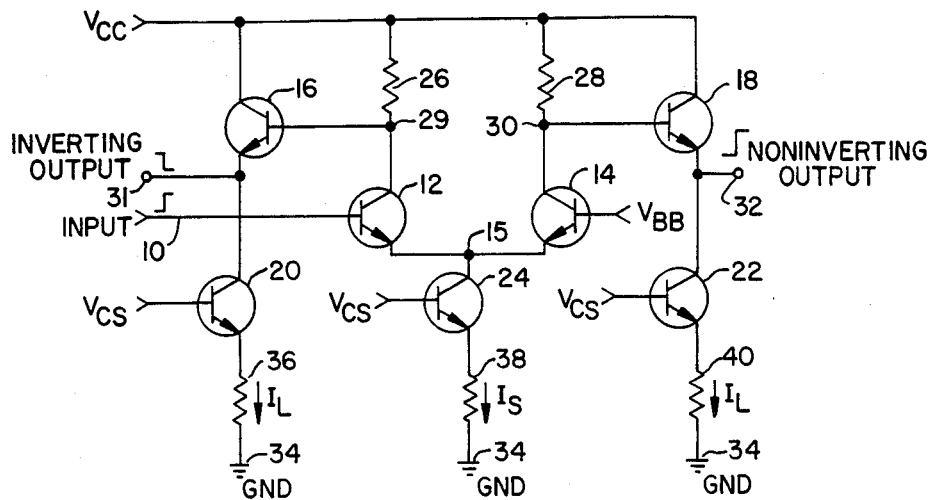
ECL GATE
FIG._1.    PRIOR ART
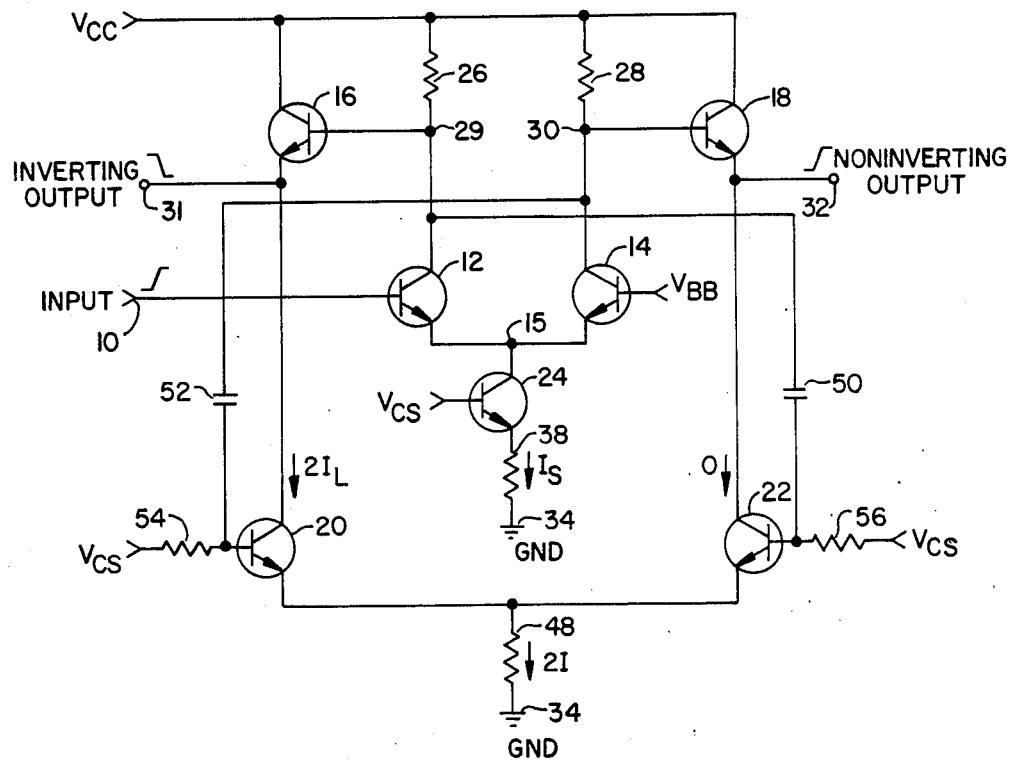
FIG._2.

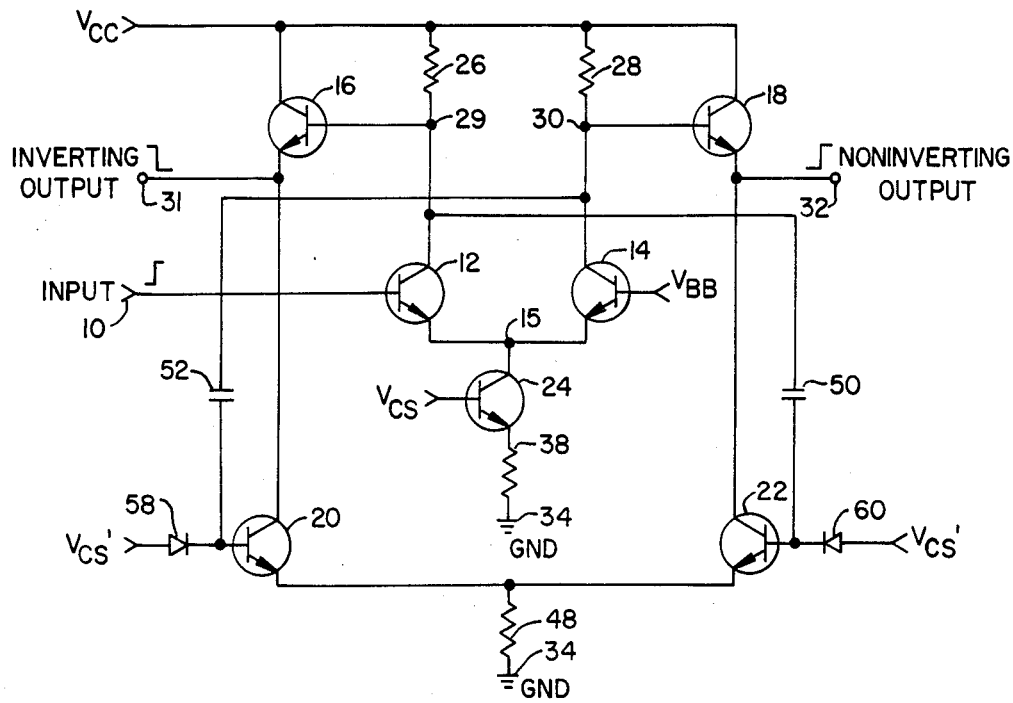
FIG._3.
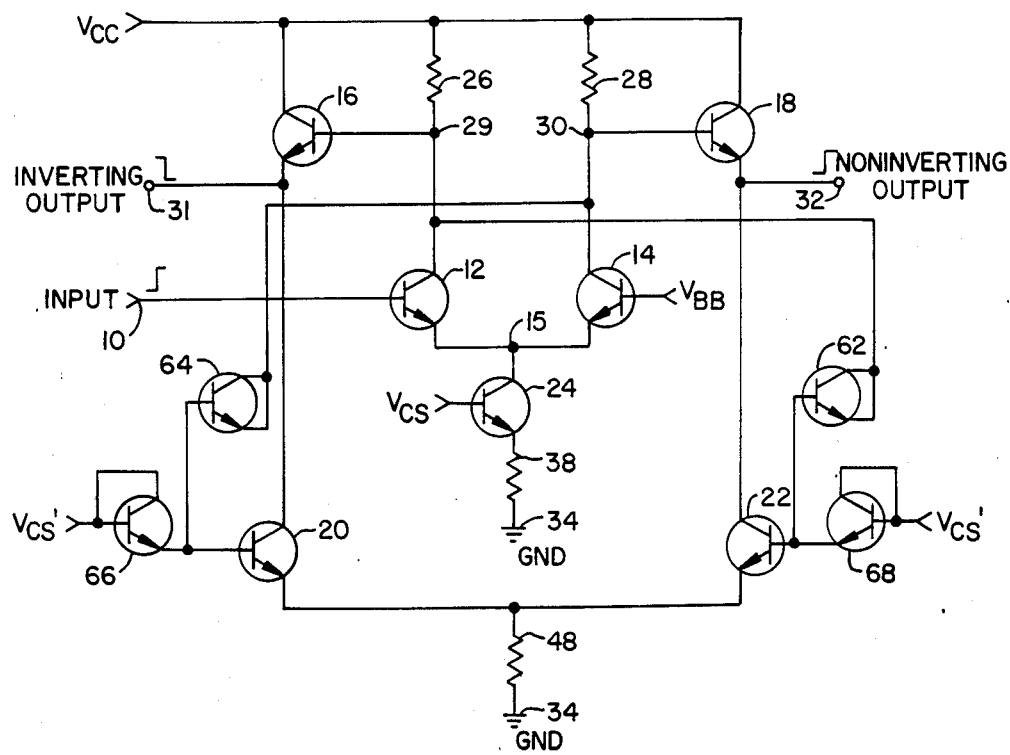
FIG._4.

DYNAMIC PUSH-PULL FOR ECL

BACKGROUND OF THE INVENTION

This invention relates to emitter coupled logic (ECL) circuits.

In standard ECL circuits, two switching transistors are connected at their emitters with the base of one transistor being connected to a reference voltage between the digital high and low voltage states. The base of the other transistor is connected to an input voltage. The connected emitters are connected to a current source transistor which provides the current to the two switching transistors (the gate current). The base of this current source transistor is connected to a current source voltage, $V_{cs}$. The collectors of the emitter coupled transistors are each connected via a resistance to a positive power supply. An output is obtained at the collector of each emitter coupled transistor upon application of an input voltage. One collector provides a non-inverting output, and the other collector provides an inverting output. Each output is often connected to an emitter follower transistor which provides greater current capacity for the output. The output is then taken from the emitter of each emitter follower, which is also connected to a current source transistor.

Each current source transistor coupled to an emitter follower has its base connected to the same current source voltage, $V_{cs}$. This provides for an equal load current to flow through each of such current source transistors. Upon an input transition from a high to a low state, or from a low to a high state, the outputs also change state accordingly. The speed with which the outputs change states depends upon the capacitance of the load connected to the output. If the output goes from a low to a high state, it must charge up the load capacitance. Conversely, if an output goes from a high to a low state, it must discharge the load capacitance. The load capacitance is charged by current from the emitter follower transistor and the supply voltage source. The load capacitance is discharged by current passing through the current source transistor to ground.

The speed with which the output changes state depends on the time which it takes the transistor to charge or discharge the load capacitance. This time is dependent upon the current flow as can be seen from the equation:

$$i = c^* dv/dt \quad (1)$$

where:
i=current;
c=capacitance;
dv=change in voltage; and
dt=change in time.

Rearranging equation (1) yields the following equation:

$$dt = c^* dv/i \quad (2)$$

Thus, it can be seen that the greater the current i, the smaller the change in time for a given change in voltage.

Upon an output going to a low state, the amount of current that can be used to discharge the capacitance is determined by a current source transistor. This current flow is fixed by the current source voltage and the value of the resistance coupled to the current source transistor. The speed of a transition to a low state is limited by this fixed current flow.

When an output goes to a high state the output capacitance must be charged. Some of the current from the supply voltage used to charge such capacitance is lost by going through the current source transistor. The loss of this current results in a slow transition time to a high state. As can be seen by the above discussion, ECL gates have inherently poor speed-power products.

SUMMARY OF THE INVENTION

The present invention is an improved ECL gate having faster output transition times without requiring additional current. Two switching transistors have their emitter terminals connected to a first current source. A reference switching transistor has its base connected to a reference voltage and an input switching transistor has its base connected to an input terminal. An emitter follower transistor is coupled to each switching transistor. A second current source is connected to each of the emitter follower transistors by coupling circuitry which shunts current from one emitter follower to the other thereby increasing the transition speed of the outputs.

In the preferred embodiment, emitters of current source transistors for the two outputs are coupled through a common resistance to ground (or another voltage which is low relative to the supply voltage). This common resistance has one-half the value of the current source resistors of a conventional ECL gate so that the total current flow through the two current source transistors is the same as for a conventional ECL gate. The collector of the inverting emitter-coupled transistor is coupled via a capacitor to the base of the current source transistor for the non-inverting output. The collector of the non-inverting emitter-coupled transistor is coupled via a second capacitor to the base of the current source transistor for the inverting output. The base of each such current source transistor for the two outputs is coupled to the current source voltage via a resistance.

The capacitance coupling essentially causes only one of such current source transistors to be turned on at any time during switching. This forces all the current which passes through the common resistor to pass through one or the other of the current source transistors. Thus, minimal current is lost through the current source transistor which is turned off when a load capacitance is being charged to a high state. Additionally, the current flow through the current source transistor which is turned on is approximately doubled when that transistor is discharging a load capacitance to a low state. The circuit uses the same amount of current as conventional ECL gates, but diverts the current to the output that needs it.

By way of example, when the collector of the inverting output transistor changes to a low state, the coupled capacitance is forced to discharge. This pulls current out of the base of the non-inverting output's current source transistor, thereby turning off the transistor. Thus minimal current is lost through such current source transistor when the emitter follower on the non-inverting output is attempting to charge an output capacitance load to a high state.

At the same time, the collector of the non-inverting emitter-coupled transistor changes to a high state, thereby charging its coupled capacitance and injecting charge into the base of the current source transistor. The current source transistor, which was initially off in this example, is turned on and virtually all the current passing through the common resistor is directed to this transistor. This allows the inverting output load capacitance to be discharged quickly because the current flow is approximately twice that of a conventional ECL gate.

The use of a single resistor for both current source transistors enables one to be turned off more easily than would be possible with separate resistors. This is because the voltage across the common resistor allows the base-emitter junction to be reverse-biased without requiring the base to be brought down to as low a voltage. The use of a resistor between the base of the current source transistors and the current source voltage allows the voltage of such bases to be controlled by the coupled capacitance.

As can be seen by the equation: $dt=c*dv/i$, the spped with which the improved ECL gate changes is doubled by virtue of the doubling of the current flow by the present invention. Alternately, through the use of this invention, an ECL gate with the same speed as conventional ECL gates can be obtained by utilizing one half the current requirements of a conventional ECL gate for the two outputs by increasing the value of the common current source resistance. This is accomplished because while only one-half the current is available, virtually all of it is forced through the output current source transistor which needs such current, i.e., the output which is going to a low state and attempting to discharge a capacitance. At the same time, virtually no current is lost through the current source transistor for the output which is charging a load capacitance to a high state.

The present invention also reduces the degradation of the high level voltage output in a conventional ECL gate. There is a voltage drop across the resistor coupled to the collector of a switching transistor due to the base current of an emitter follower transistor. This voltage drop reduces the high level voltage output. The common current source of the present invention reduces the emitter current of any one emitter follower in a steady-state condition, thus reducing the base current of the emitter follower resulting in less degradation of the high level voltage output.

In the preferred embodiment a diode, rather than a resistor, is used to connect the current source transistor's base to the current source voltage. The diode performs the same isolation function as the resistor by allowing the voltage at the base of the current source transistor to be controlled by the capacitance. The diode also prevents leakage of current into the current source voltage from the capacitance, which would occur if the resistor is used. This diode could be constructed in an integrated circuit by using a transistor with its base coupled to its collector to form the anode of such diode. Additionally, the capacitance can be constructed in an integrated circuit by using a transistor with its emitter and collector coupled together.

BRIEF DESCRIPTION OF THE DRAWINGS

FIG. 1 is a schematic drawing of a conventional ECL gate.

FIG. 2 is a schematic drawing of a first preferred embodiment of the invention.

FIG. 3 is a schematic drawing of a second preferred embodiment of the present invention utilizing diodes to couple the current source transistors to the current source voltage.

FIG. 4 is a schematic drawing of a third preferred embodiment of the present invention utilizing integrated circuit transistors to form the required capacitance and diodes.

DETAILED DESCRIPTION OF THE PREFERRED EMBODIMENTS

The present invention is best understood with reference to the operation of a conventional ECL gate as shown in FIG. 1. An input 10 is connected to the base of a transistor 12. Transistor 12 has its emitter coupled to the emitter of a second transistor 14 at a node 15. Transistors 12 and 14 form the emitter coupled transistor pair. Emitter follower transistors 16 and 18 are coupled to the respective collectors of transistors 12 and 14 to isolate the output loads from the collector of the emitter coupled transistors 12, 14. Emitter follower transistors 16 and 18 are coupled to corresponding current source transistors 20 and 22 respectively. A third current source transistor 24 is coupled to the emitters of the emitter coupled transistors 12 and 14.

The base of transistor 14 is connected to a reference voltage $V_{BB}$. The collectors of transistors 12 and 14 are coupled to a supply voltage $V_{cc}$ via resistors 26 and 28, respectively. The collectors of transistors 12 and 14 are also coupled to the bases of emitter follower transistors 16 and 18, respectively, at nodes 29 and 30, respectively. The emitters of emitter follower transistors 16 and 18 are connected to outputs 31 and 32, respectively. Output 31 is an inverting output while output 32 is a non-inverting output. The emitters of emitter followers 16 and 18 are also coupled to the collectors of current source transistors 20 and 22, respectively.

The emitters of current source transistors 20, 22 and 24 are coupled to ground 34 via resistors 36, 38 and 40, respectively. The bases of current source transistors 20, 22 and 24 are connected to a current source voltage $V_{cs}$. The use of ground 34 simply shows one embodiment. Another embodiment, for example, would be to substitute some negative voltage for ground.

In operation, a current $I_s$ is pulled from the emitters of emitter transistors 12 and 14 to ground 34 by current source transistor 24. The value of this current is determined by the voltage drop across resistor 38, which is equal to $V_{cs}$ less the base-emitter voltage of transistor 24. Substantially all of this current will flow through one or the other of emitter coupled transistors 12 and 14, depending upon whether input 10 is above or below reference voltage $V_{BB}$.

The voltage at the coupled emitters of transistors 12 and 14 is determined by the value of $V_{BB}$ less the base-emitter voltage drop, $V_{be}$, of transistor 14. When a low voltage is applied to input 10, this voltage reverse biases the base-emitter junction of transistor 12, thus shutting off transistor 12 so that substantially all the current of transistor 24 flows through transistor 14. When a high voltage is applied to input 10, this forward biases the base-emitter junction of transistor 12 causing current to flow through it. The high input voltage has the effect of raising the voltage level of node 15, thereby reverse biasing the base-emitter junction of transistor 14. Thus, transistor 14 is turned off and substantially all of the current flows through transistor 12.

For purposes of example, consider the voltage at input 10 changing from a low to a high state. As discussed before, transistor 12 will turn on, thereby forcing all of current $I_s$ of current source transistor 24 to flow through resistor 26. This forces node 29 to a low state determined by the voltage drop across resistor 26. At the same time, transistor 14 is turned off as discussed above, and virtually no current flows through resistor 28. Therefore, node 30 is pulled up to the value of $V_{cc}$. The high voltage at node 30 appears at the base of emitter follower transistor 18, turning it on and causing current to flow through transistor 18 to output 32. This current will charge the capacitance of the load connected to the output to a high state. At the same time, some of current flowing through transistor 18 will also flow through current source transistor 22 to ground. This current flow through transistor 22 is wasted, thereby increasing the time taken to charge the output load capacitance coupled to output 32.

Returning to node 29, when it changes to a low state, the base of emitter follower transistor 16 is forced to a low state thereby turning off emitter follower 16. Thus output 31 is brought to a low state equal to the low voltage at node 29 less the base-emitter voltage drop, $V_{be}$, of transistor 16. When output 31 changes to a low state, the capacitance of the load connected to such output is discharged. The current from such capacitance flows through current source transistor 20 to ground. The amount of such current is determined by the value of resistor 36, in the same manner as discussed above for resistor 38 above. It can be seen that the speed with which output 31 can change to a low state is limited by the value of such current.

Turning now to FIG. 2, there is shown the first preferred embodiment of the invention. As in the conventional ECL gate of FIG. 1, input 10 is coupled to transistor 12 which has its emitter coupled to the emitter of transistor 14 (node 15). Emitter follower transistors 16 and 18 are coupled to the collectors of transistors 12 and 14, respectively. Current source transistors 20 and 22 are coupled to the emitters of emitter followers 16 and 18, respectively. Current source transistor 24 couples the emitters of transistors 12 and 14 to ground via resistor 38. Resistors 26 and 28 couple the collectors of transistors 12 and 14 (nodes 29 and 30), respectively, to supply voltage $V_{cc}$. Inverting output 31 is coupled to the emitter of emitter follower transistor 16, and non-inverting output 32 is coupled to the emitter of emitter follower transistor 18.

The present invention differs from the conventional ECL gate in the following respects. The emitters of current source transistors 20 and 22 are coupled to ground 34 via a shared resistor 48. If the value of resistor 48 is half the value of resistors 36 and 40 of FIG. 1, the total current through transistors 20 and 22 will be the same as for the circuit of FIG. 1. A capacitance 50 couples node 29 to the base of current source transistor 22, and a capacitance 52 couples node 30 to the base of current source transistor 20. A resistance 54 is coupled between current source voltage $V_{cs}$ and the base of transistor 20 and a resistance 56 is coupled between current source voltage $V_{cs}$ and the base of transistor 22. The actual values for resistance and capacitance used are a matter of engineering choice and depend on the process limitations for the circuit used and the desired characteristics of the circuit. By way of example, if a load current $I_L$ of 200 microamps is used, a capacitance of 0.1 pF (picofarads) may be used for capacitors 50 and 52.

The operation of the circuit of FIG. 2 can be understood by considering an input voltage going from a low state to a high state. Upon the voltage at input 10 to the base of transistor 12 going from a low to a high state, transistor 12 is turned on and transistor 14 turned off as discussed with respect to the conventional ECL gate above. Thus, node 29 and inverting output 31 are forced to the low state, while node 30 and non-inverting output 32 are forced to the high state, again as discussed above. As node 30 comes to a high state, this high voltage serves to charge capacitor 52, thus supplying current to the base of transistor 20 causing it to turn on and conduct. At the same time, node 29 is going low, thereby causing capacitor 50 to discharge, thus pulling current out of the base of transistor 22 and forcing the base to a low voltage. This low voltage causes transistor 22 to turn off, thereby forcing virtually all the current through resistor 48 to come from transistor 20. Thus, when inverting output 31 goes low, transistor 20 conducts approximately twice the current of transistor 20 in the conventional ECL gate of FIG. 1. The output load capacitance is thus discharged at approximately twice the rate of a conventional ECL gate and a faster transition results. Also, since transistor 22 is turned off, emitter follower 18 can charge the load capacitance coupled to non-inverting output 32 at a faster rate because virtually no current is lost through transistor 22.

Resistor 48 can be chosen with a value such that the total current flow through it is equal to current flow through one of resistors 38 or 40 of the conventional circuit of FIG. 1. Since all of this current can be forced through either transistor 20 or transistor 22, the current requirements of such transistors can be cut in half. At the same time, the current flowing through the transistor coupled to the output going low remains the same current as in the conventional circuit and thus the same transition speed is maintained.

In a steady state condition, the load capacitance will have been charged or discharged and the current through common resistor 48 will flow approximately equally through emitter followers 16 and 18. When output 32 is at a high level $V_{OH}$, this high level is equal to $V_{cc}$ less the voltage drop across resistor 28 and the base-emitter voltage of transistor 18. By using a common current source resistor 48 with the same value as one resistor of a conventional ECL gate, the emitter current of transistor 18 is reduced to approximately half that of a conventional ECL gate. The base current of transistor 18 is proportionately reduced, thus reducing the voltage drop across resistor 28 and increasing the high level voltage output, $V_{OH}$. The high $V_{OH}$ gives the circuit greater immunity to noise.

Referring now to FIG. 3, a second preferred embodiment of the present invention is shown. As can be seen, resistors 54 and 56 of FIG. 2 have been replaced by diodes 58 and 60. In the circuit of FIG. 2, a portion of the current injected into the base of transistor 20 by capacitor 52 is lost through resistor 54. By utilizing diode 58 with its anode coupled to $V_{cs}'$ and its cathode coupled to the base of transistor 20, this current loss is prevented. The reverse biasing of the diode prevents any current from flowing through the diode and thus all of the injected current goes into the base of transistor 20. The same applies to diode 60 when output 32 is forced to a low state. The use of diodes 58 and 60 is preferably done with a separate source voltage, $V_{cs}'$. The reason for the separate voltage source is that the original current source voltage, $V_{cs}$, which is still used for transistor 20, will track the temperature characteristics of only a single base-emitter junction. Voltage $V_{cs}'$ has to track the temperature characteristics of a single base-emitter junction plus a diode junction.

Referring to FIG. 4, there is shown a schematic diagram of a third preferred embodiment of the present invention which is implemented in an integrated circuit. Capacitors 50 and 52 of the circuit of FIG. 3 are formed by transistors 62 and 64, respectively. These transistors have their emitters and collectors coupled together to form one lead. The total capacitance of transistors connected in such a manner is the base-collector capacitance and the base-emitter capacitance connected in parallel. A transistor is used for a capacitor because it can occupy less space for the same capacitance value in an integrated circuit. Additionally, diodes 58 and 60 of the circuit of FIG. 3 are formed with transistors 66 and 68, respectively. Transistors 66 and 68 are made to act as diodes by coupling their collectors to their bases.

The present invention can be implemented in a wide variety of logic gates, such as OR/NOR gates and AND/NAND gates, in both single and multiple level systems. An OR/NOR gate, for instance, would be created by adding another input switching transistor in parallel with input switching transistor 12.

As will be understood by those familiar with the art, the present invention may be embodied in other specific forms without departing from the spirit or essential characteristics thereof. Accordingly, a disclosure of the preferred embodiments of the present invention is intended to be illustrative, but not limiting, of the scope of the invention which is set forth in the following claims.

What is claimed is:

1. An emitter coupled logic (ECL) circuit comprising:
   at least two switching transistors formed of a reference switching transistor and an input switching transistor and having their emitter terminals coupled to a first current source, said reference switching transistor having a base terminal coupled to a reference voltage terminal, said input switching transistor having a base terminal coupled to an input terminal;
   a pair of emitter follower transistors, a first emitter follower transistor coupled to the reference switching transistor, a second emitter follower transistor coupled to the input switching transistor;
   a second current source connected to each transistor of the emitter follower pair;
   means connected to each switching transistor for exclusively coupling the second current source to one of the first and second emitter follower transistors dependent upon which switching transistor is conductive;
   said coupling means including a pair of coupling transistors having their emitter terminals connected to said second current source, a first coupling transistor having its collector terminal connected to an emitter terminal of the first emitter follower transistor and its base terminal coupled to a collector terminal of the input switching transistor, a second coupling transistor having its collector terminal connected to an emitter terminal of the second emitter follower transistor and its base terminal coupled to a collector terminal of the reference switching transistor;
   each base terminal of the coupling transistor pair being connected to the collector terminals of the switching transistors by capacitance means;
   said second current source being formed of a resistance means connected between the emitter terminals of the coupling transistors and a voltage supply terminal; and
   a diode being connected between each of the base terminals of the coupling transistors and a current source voltage terminal to prevent any current from flowing between the base terminals and the current source voltage terminal during switching;
   whereby the delay in switching speeds caused by load capacitance on the emitter follower transistors is reduced.

2. The ECL circuit of claim 1 wherein said diode means comprises a pair of diodes, said diodes having their cathode connected to the base terminals of said current source transistors and having their anode connected to the current source voltage.

3. The ECL circuit of claim 1 wherein the capacitance means comprises a transistor having its collector connected to its emitter.

4. The ECL circuit of claim 1 wherein each of the diodes comprise a transistor having its collector connected to its base.

5. The ECL circuit of claim 1 further comprising at least a third switching transistor having an emitter terminal connected to the first current source, a collector terminal connected to the collector terminal of the input switching transistor and a base terminal connected to a second input terminal,
   whereby a multiple input logic circuit is formed.

6. An emitter coupled logic (ECL) circuit comprising;
   at least two switching transistors formed of a reference switching transistor and an input switching transistor and having their emitter terminals coupled to a first current source, said reference switching transistor having a base terminal connected to a reference voltage terminal, said input switching transistor having a base terminal connected to an input terminal;
   a pair of emitter follower transistors, a first emitter follower transistor connected to the reference switching transistor, a second emitter follower transistor connected to the input switching transistor;
   a current source resistor coupled to a voltage supply terminal;
   a pair of current source transistors having their emitter terminals connected to said current source resistor, a first current source transistor having its collector terminal connected to an emitter terminal of the first emitter follower transistor, a second current source transistor having its collector terminal connected to an emitter terminal of the second emitter follower transistor;
   a pair of capacitors, a first capacitor coupling the base terminal of said first current source transistor to a collector terminal of the input switching transistor, a second capacitor coupling the base terminal of said second current source transistor to a collector terminal of the reference switching transistor; and
   diode means, coupling the base terminals of said current source transistors to a current source voltage, for preventing any current from flowing between the base terminals and the current source voltage during switching;
   whereby the delay in switching speeds caused by load capacitance on the emitter follower transistors is reduced.

* * * * *